(12) United States Patent
Dutta et al.

(10) Patent No.: US 8,791,358 B1
(45) Date of Patent: Jul. 29, 2014

(54) ENERGY SCAVENGING DEVICES AND MANUFACTURING THEREOF

(75) Inventors: Achyut Kumar Dutta, Sunnyvale, CA (US); Robert Olah, Sunnyvale, CA (US)

(73) Assignee: Banpil Photonics Inc., Santa Clara, CA (US)

( * ) Notice: Subject to any disclaimer, the term of this patent is extended or adjusted under 35 U.S.C. 154(b) by 489 days.

(21) Appl. No.: 12/573,091

(22) Filed: Oct. 2, 2009

Related U.S. Application Data

(60) Provisional application No. 61/102,356, filed on Oct. 2, 2008.

(51) Int. Cl.
| | | |
|---|---|---|
| *H01L 31/058* | (2006.01) | |
| *G05F 1/67* | (2006.01) | |
| *H02J 7/35* | (2006.01) | |
| *H01L 31/02* | (2006.01) | |
| *H01L 31/12* | (2006.01) | |

(52) U.S. Cl.
CPC .......... *H01L 31/02021* (2013.01); *H01L 31/12* (2013.01); *G05F 1/67* (2013.01); *H02J 7/35* (2013.01)
USPC .......................................... 136/255; 136/252

(58) Field of Classification Search
CPC ...................................................... H01L 31/12
See application file for complete search history.

(56) References Cited

U.S. PATENT DOCUMENTS

| | | | | |
|---|---|---|---|---|
| 4,740,431 A | * | 4/1988 | Little ................................. | 429/9 |
| 5,626,976 A | * | 5/1997 | Blanton et al. ..................... | 429/9 |
| 6,300,158 B1 | * | 10/2001 | Simburger et al. ............. | 438/59 |
| 6,608,464 B1 | * | 8/2003 | Lew et al. ...................... | 320/107 |
| 2007/0137698 A1 | * | 6/2007 | Wanlass et al. ............... | 136/261 |
| 2007/0204901 A1 | * | 9/2007 | Dutta .............................. | 136/256 |
| 2008/0121272 A1 | * | 5/2008 | Besser et al. .................. | 136/248 |
| 2008/0179961 A1 | * | 7/2008 | Kimball et al. ................. | 307/82 |

OTHER PUBLICATIONS

Dictionary.com definition of the word "substrate" (dictionary.reference.com/browse/substrate), accessed Feb. 11, 2012.*
Merriam-Webster Online dictionary—definition of "circuit" (Aug. 8, 2012).*

* cited by examiner

*Primary Examiner* — Jennifer Michener
*Assistant Examiner* — Christopher Danicic

(57) ABSTRACT

This invention is related to energy scavenging device and in particular, to energy harvesting or scavenging from the environmental radiation covering from solar spectrum and thermal radiation. Energy harvesting device is an integrated device comprising the devices that capture the radiation and converted into electrons, and also energy management devices to manage the converted energy either to store, to operate the electronic devices, and/or recharge the batteries. The energy scavenging devices integrates several device capabilities such as energy conversion, management, and storing the energy, on a common platform. Herein a design of a device capable to scavenge or harvest the energy from environment radiation is disclosed. A primary objective of this invention is to provide a design of a scavenging device that harvests the energy from environment radiation, operates 24/7, thereby generate and store, manage the energy as required.

6 Claims, 23 Drawing Sheets

Prior art energy scavenging value

| Technology | Power Density [μW/cm²] | Power Density [W/m²] |
|---|---|---|
| Vibration – electromagnetic | 4.0 | 0.04 |
| Vibration – piezoelectric | 500 | 5 |
| Vibration – electrostatic | 3.8 | 0.038 |
| Thermoelectric (5 degree C difference) | 60 | 0.6 |

FIG. 1

$$W(\lambda) = \frac{c_1}{\lambda^5 (e^{c_2/\lambda T} - 1)}$$

$$c_1 = 2\pi c^2 h = 37418.32 \, w\mu^4 cm^{-2}$$

$$c_2 = hc/k = 14387.86 \, \mu K$$

c speed of light
k Boltzman's constant
h Planck's constant
Lamda-wavelength
T temperature in Kelvin

FIG. 2B

ENERGY SCAVENGING DEVICES AND MANUFACTURING THEREOF

CROSS-REFERENCE TO RELATED APPLICATIONS

This application claims the benefit of U.S. Provisional Application No. 61/102,356 filed on Oct. 2, 2008.

FIELD OF THE INVENTION

This invention is related to energy scavenging device and in particular, to energy scavenging from the environmental radiation covering from solar spectrum and thermal radiation. Energy harvesting device is an integrated device comprising the devices that capture the radiation and converted into electrons, and also energy management devices to manage the converted energy either to store, to operate the electronic devices, and/or recharge the batteries. The energy scavenging devices integrates several device capabilities such as energy conversion, management, and storing the energy, on a common platform.

BACKGROUND OF THE INVENTION

Current electronic systems are typically powered by batteries, continuing energy supplies, or other energy stored devices. This approach is acceptable when it is feasible to replace batteries, when it is connected to the continuous energy supplies, or when it is acceptable to discard the systems when the batteries or stored energy run down. In the cases, if the systems is located in place difficult to get to, or if the system having large number of nodes distributed over large geographic area (e.g. especially communication systems), then that may not possible to replace the stored devices (e.g. batteries) when required. A self sufficient energy generation source (harvesting energy) deriving its power from the environment and thus not requiring any maintenance are desirable in these instances. The energy scavenging device can recharge the batteries. Energy scavenging device helps to run the electronic system for indefinite life time without any maintenance.

Energy can be harvested from several sources to power electronics. (a) Mechanical methods: If motion is available power can be generated from matching the frequency of vibration or discrete impact. Mechanical energy conversion techniques have obtained 250 μw/cm$^3$ at an excitation of 250 mG; (b) RF energy method; If RF signals are present and have sufficient amplitude, energy can be harvested from RF signals; (c) Thermal methods: Thermoelectric devices have successfully been implemented where there are large thermal gradients, usually metal smelters or blast furnaces.

Energy "harvesting" from mechanical, mostly vibration, requires the capture of mechanical energy and conversion into electrical energy. The key requirement for many electrical energy-generating technologies, such as electroactive polymers, is the ability to produce movement against a load (i.e., provide the mechanical work that will be converted to electrical energy). Up to now, attempts to extract such energy have been extremely limited in terms of wattage (i.e., 10-20 microwatts).

More recently, Pelrine et al. suggested in published U.S. Pat. No. 6,768,246 that electroactive polymer devices could be used to generate electrical energy by converting mechanical energy generated by heel strikes during walking into electrical energy. Likewise, energy can be also harvested from RF signal and also from thermal effects. The former requires sufficient RF signal to harvest enough energy to drive the electronic system, and the later requires the thermal differences, which generate the energy on Seebeck effect. However, there are situations where none of these energy sources from where energy can be scavenged, are available. Electronic devices or systems are continually decreasing in energy necessary to operate. Excluding RF, mechanical, and thermal methods of generating energy, there is still energy that can be harvested from the environment to sufficiently power electronic devices.

Energy scavenging based on solar and/or infrared wavelength energy from thermal radiators are developed to efficiently generate power. According to this invention, a novel cost-effective, high efficient environmental scavenger that can scavenge energy at ambient temperature to drive the electronic devices.

In order for energy scavenging to be viable as a future energy source, reliability, and cost of energy scavenging must be comparable with the conventional energy generation sources such as the generators, fuel-cells, or batteries, or their replacement. Currently scavenging energy from environment, sufficient to drive the electronic systems is lagging significantly, in both these areas.

Accordingly, there remains a strong need to develop a device capable of scavenging energy on the order of hundreds of watts, particularly for military applications.

All ambient temperature bodies radiate photons. At environmental temperature, photons have wavelengths between 3 to 14 micrometers, especially in dark situation. In day condition, where appreciable light is present (either sun-light and/or human generated lights) photons have wavelengths from UV (or near UV) to 3.5 micrometers. Significant energy can be harvested 24/7 from these environment-radiation, where photons having wavelengths extending from UV to 14 micrometers, (even over 14 micrometers). Accordingly, there remains a strong need to develop a device capable of generating energy from environment radiation 24/7. The present invention is designed to address these needs in the art.

According to this invention, a device is developed to convert these photons to electrons that could generate enough energy to operate electronic devices. Between 3 and 14 micrometers enough photons are being generated in dark condition, and during day near UV to 3.5 micrometers wavelengths ranges, enough photons are generated which make the device to operate in 24/7. If these photons converted to electrons could harvest significant energy and can power an efficiently designed device. Power that could be generated by efficient conversion is in the tens of milliwatt/cm$^2$ in magnitude.

In this application a design of a device capable to scavenge or harvest the energy from environment radiation is disclosed. Those skilled in the art will appreciate that the principles of the invention disclosed herein, and further defined by the scope of claims to follow, are merely illustrative and are not construed to be limited to specific examples of structure and materials used to explain the principles in this document.

SUMMARY OF THE INVENTION

One objective of this invention is to provide a design of a scavenging device that harvests the energy from environment radiation, operates 24/7, thereby generate and store, manage the energy as required.

A second objective of this invention is to provide a device, integral part of the scavenging device, capable to generate the energy from the thermal radiation, without presence of the thermal differences.

Accordingly, a device disclosed in this invention utilizes HgCdTe alloy semiconductor for harvesting energy from the thermal radiation, comprises the p-i-n or pn-junction formed on the lattice matched or lattice unmatched substrate, wherein substrate is later thinned out or the device is transferred to the foreign substrate.

A third objective of this invention is to provide a device, integral part of the scavenging device, capable to generate the energy from the visible and near-infrared lights.

Accordingly, a device disclosed in this invention utilizes III-V alloy semiconductor for harvesting energy from the day lights, wavelengths extending from near UV to 2.5 micrometers, comprises the p-i-n or pn-junction formed on the lattice matched or lattice unmatched substrate, wherein substrate is later thinned out or the device is transferred to the foreign substrate. Alternatively, device comprises with the more than one nano-scaled 3-dimensional blocks having p-i-n or pn (or n-i-n or p-i-p) junction in it. Advantageously, such a structure comprising with multiple nano-scaled 3-dimensional blocks absorbs photon flux from a larger section of the spectrum thereby, improving sensitivity, thereby increasing the conversion efficiency of the photon energy into electrical energy. An exemplary system according to the principles of this invention utilizes indium phosphide (InP) nanostructures embedded in a matrix forming the device.

Alternatively, silicon based material such as crystal Si, a-Si, Si:Ge, InGaAs can be used for the device capable to harvest the energy from the day light.

Accordingly, it is also an object to design a harvesting generator device integral part of the scavenging device unit to manage the energy for either storing and/or recharging the batteries, if any to be connected to the proposed scavenging device, comprising, integrated circuits capable to store, manage, and/or recharge the batteries, and connected to devices, generating the energy from the day lights and thermal radiation, (especially in dark conditions)

Another objective of this invention is to provide the design of a scavenging device comprising, at least capable to generate the energy from the day lights, an integrated circuits capable to manage the generated energy, at least one device capable to generate the energy from the thermal radiation.

According to the invention, it is an object to provide a structure of the alternative scavenging generator device having broadband absorption capability, comprising, (i) a substrate; (ii) an ohmic contact layer; (iii) more than one micro-nano-scaled 3-D blocks, spaced with specific pitch or randomly arranged, each of block comprises with p-i-n structure or p-n structure (or n-in or p-i-p), (a) doped layer either complete buffer layer with the thinned substrate and/or a portion of substrate layer (b) intrinsic (i-type) layer is formed using i-type semiconductor (e.g. Si:Ge, InP, InGaAs, GaAs, SiGe, Si, HgCdTe etc.) for absorption layer, grown on the top of the first doped layer; (c) a thin layer of second doped or lightly doped layer of semiconductor on the top of absorption layer; (iv) each 3-D block is separated by certain pitch or randomly arranged, (v) the space between the 3-D blocks are filled or not filled by the insulator, (vi) a transparent layer of metal contact layer making the contact the top surface of the 3-D blocks, (vii) second metal contact, making ohmic contact on the bottom part of the 3-D blocks, top of the thick doped layer, or on the top of the substrate, wherein the radiation is illuminated surface (opening area) could be the circular, rectangular or square shaped, and they are designed in a way that radiation can be illuminated either from the top surface or from the bottom surface (substrate side).

To avoid large resistance due to the abrupt junction formation, the gradual doping can be used in between intrinsic absorption layer and the second highly doped layer. A thin layer of spacer layer of type second layer can be used in between the second highly doped layer and intrinsic layer.

Alternatively, the top ohmic contact can be also replaced by a metal layer. Which could be used for bonding purposes.

Another objective of this invention is to provide quantitative results, showing the benefits of this device, capable to scavenge the energy from the environment radiation.

Yet another objective of this invention is to provide a harvesting device. Accordingly, a scavenging device disclosed in this invention combines the principles of efficient photon collection with principles of efficient photo-carrier collection to harvest the energy in 24/7 with improved overall efficiency of the hybrid device.

Yet another objective of this invention is to provide a flexible and portable harvesting device. Accordingly, a scavenging device disclosed in this invention combines the principles of efficient photon collection with principles of efficient photo-carrier collection to harvest the energy in 24/7 with improved overall efficiency of the hybrid device.

Yet another objective of this invention is to provide a scavenging device at a cost comparable with replacement of the batteries or other energy stored device. Accordingly, a scavenging device disclosed in this invention by way of example, utilizes a very small amount of semiconductors for both devices, capable to scavenge the energies from both day and night radiations. Since less semiconductors are used and since day and night energy harvesting is possible, the overall cost of the scavenging device is significantly reduced while the device operates 24/7.

Yet another objective of this invention is to provide scavenging device which can be fabricated on the low-cost substrate other than the semiconductor, such as glass, ceramic, sapphire, polymer, or metal substrate. The scavenging device can be attached to any daily usable items, such as cloths, tents, hats, helmet, back-pack etc. This allows harvesting energy, while usual work is carried out such as working or moving etc.

Another objective of this invention is to provide manufacturing processes for scavenging devices that are commensurate with currently available technologies of assemblies, as well as the devices fabrication while keeping provision to incorporate future advances in materials and processing technologies. Accordingly, this invention discloses manufacturing processes for scavenging devices utilizing conventional fabrication process, or by transferring pre-fabricated devices from another substrate and integrating the same in a matrix of another material exhibiting harvesting energy capability, such materials including but not limited to, crystalline semiconductor, amorphous semiconductor, ceramics, metal, photosensitive polymers and/or a combination thereof, using conventional manufacturing.

BRIEF DESCRIPTION OF THE DRAWINGS

Other aspects, features, and advantages of the present invention will become apparent from detailed description, in view of a brief description of accompanying drawings in which:

FIG. 1 summarizes the prior art scavenging energy possible in various prior techniques;

FIG. 2B is a Planck's blackbody radiation equation;

DETAILED DESCRIPTION OF THE INVENTION

Figure 2A:
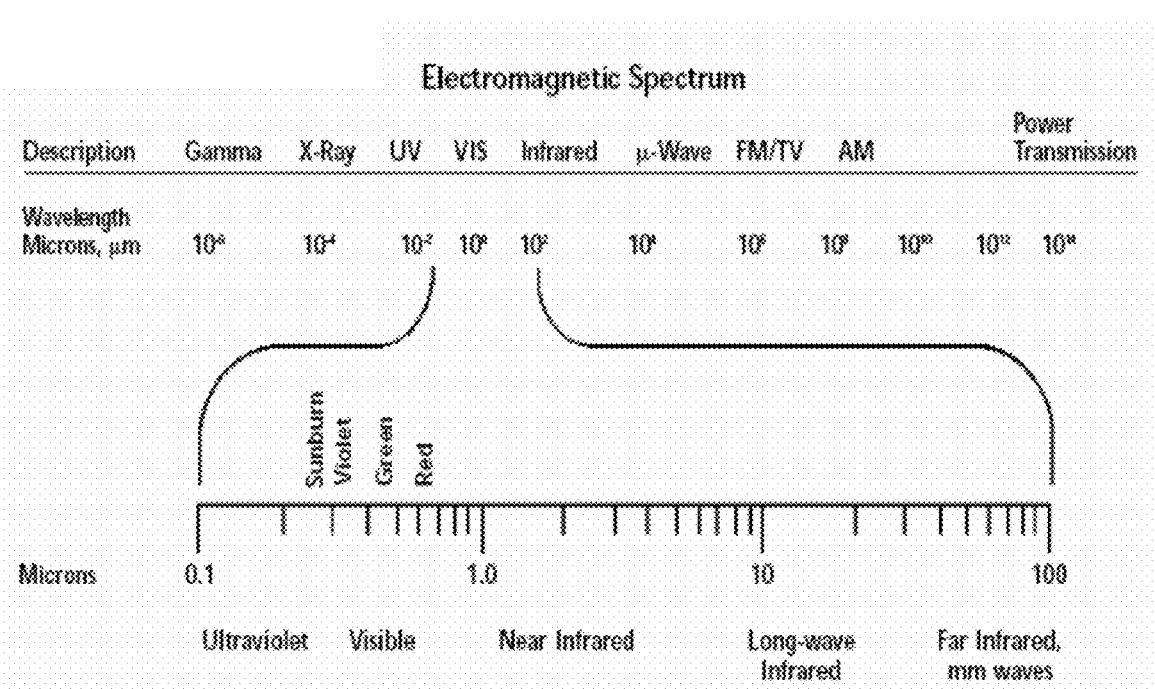
FIG. 2A is a schematic representation of the electromagnetic spectrum wherein wavelength 0.1 to 14 micrometers are considered herewith.

The principles of the invention may be appreciated by the description of exemplary embodiments disclosed in the specification in view of the accompanying drawing FIGS. 1-12 in which like parts are indicated by like reference numerals in all the drawing figures to avoid repetitions in describing them. Although this description provides detailed examples of possible implementations of the present invention, it should be noted that these details are intended to be exemplary and in no way delimit the scope of the invention.

Energy Available in Environmental Radiations:

FIG. 2A shows the electromagnetic spectrum having the wavelengths extending shorter wavelengths to longer wavelengths (long infrared). Radiations from UV to 15 micrometer are available from the environments, of which UV (near UV) to 3.5 micrometer wavelengths radiations are available from day light, mainly coming from the solar system, and wavelengths extending from 3 micrometer to 15 micrometer are obtained from the thermal radiations, especially from blackbody radiations.

Radiations from sun light available in the earth is approximately 1 kW/sq. meter. A device capable to convert the day light into electrical energy uses the principle of the photovoltaic effect. More than 60 to 300 Watt/sq. meter can be converted into electrical energy.

Figure 3A:
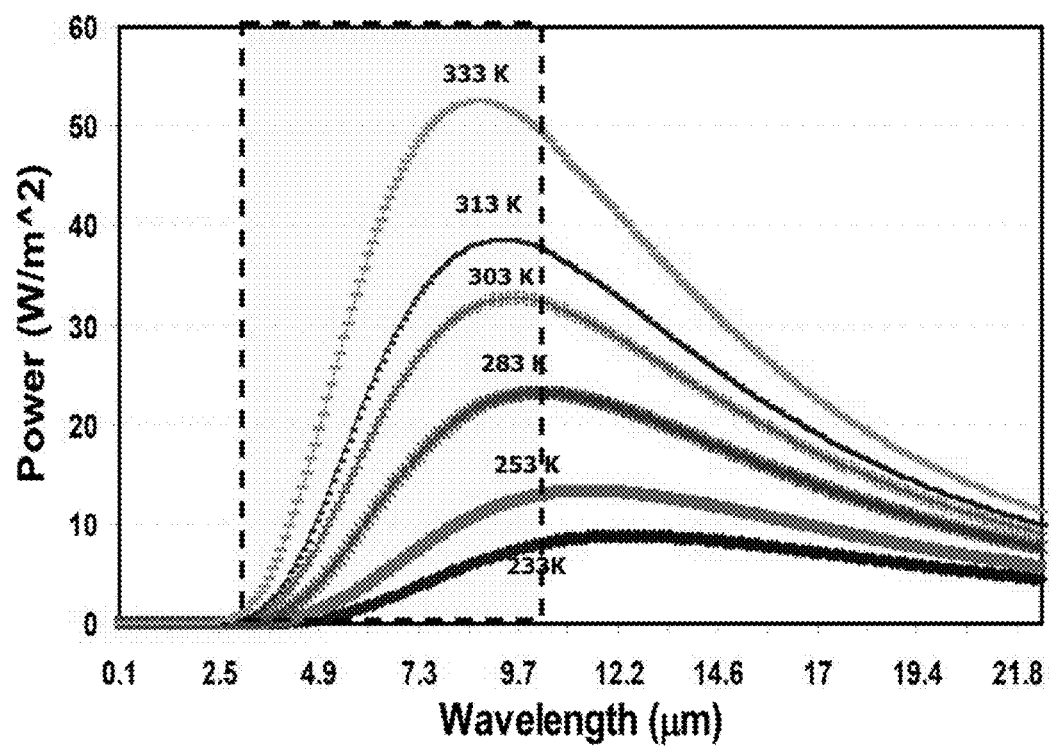
FIG. 3A is a simulated blackbody radiation curve plotted for temperatures from 233 kelvin to 333 kelvin, according to this invention.

Radiation from a blackbody at a specific temperature is determined by Planck's blackbody radiation law as shown in FIG. 2B. A plot of Planck's radiation equation for temperature ranges of 233 Kelvin (−40 C) to 333 Kelvin (+60 C) is shown in FIG. 3A. As depicted, radiation from blackbody radiation is predominate from 3 to 15 micrometer. As can be seen as the temperature increases the wavelength at the peak energy decreases. The total amount of energy generated at a specific temperature and available to be harvested at body temperature of 310 Kelvin is about 500 watts per square meter. If this energy can be harvested it would supply plenty of energy to continuously charge the battery.

Figure 3B:
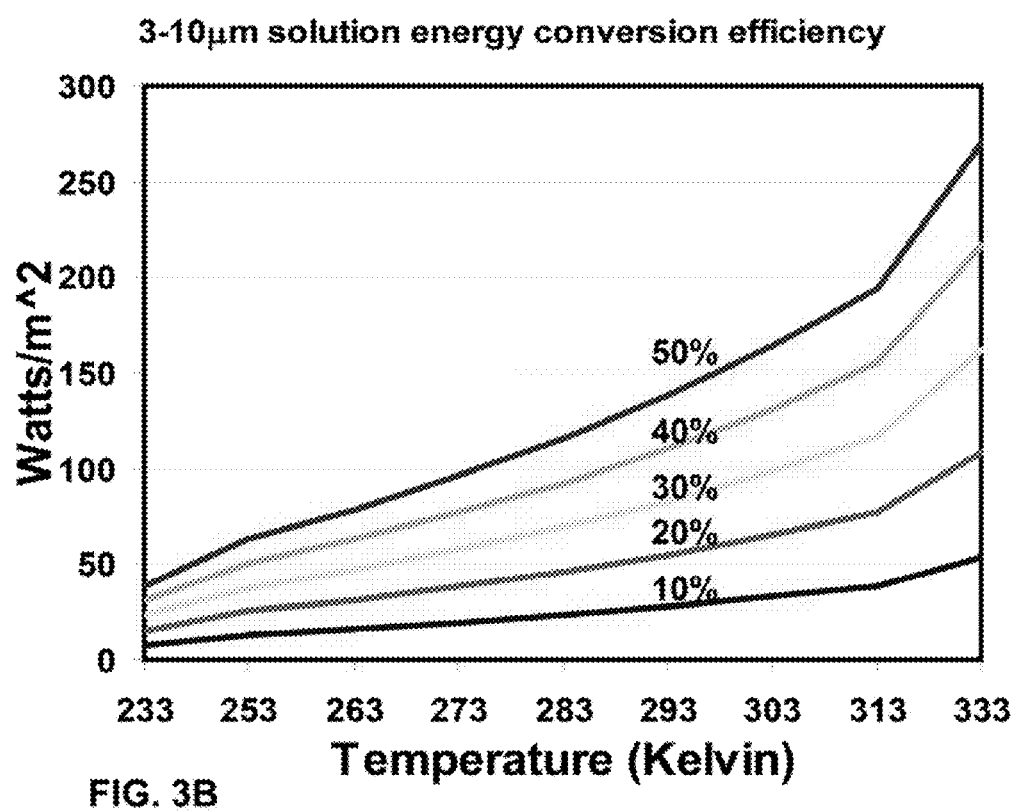
FIG. 3B is simulated potential infrared energy harvest versus efficiency for 3-10 micrometer wavelengths in accordance to this present invention.
Figure 3C:
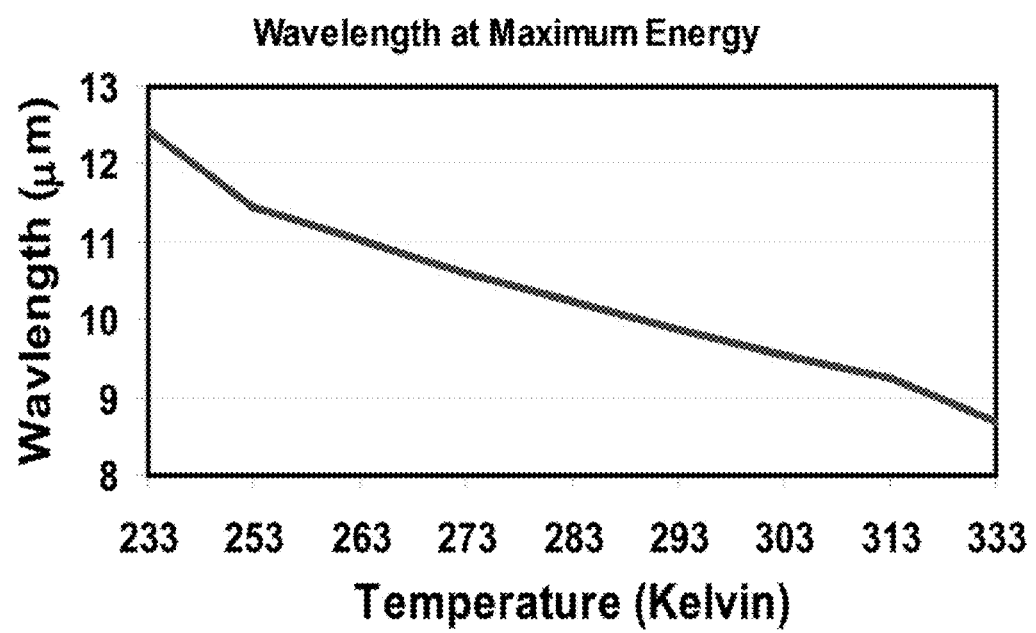
FIG. 3C is the simulated result of wavelength at maximum energy versus temperature in accordance to this present invention.

The peak wavelength for maximum energy for blackbody temperature is 9 microns as can be seen in FIG. 3C. A harvesting solution that is centered around this peak frequency or can be adjusted to this frequency range is HgCdTe. HgCdTe energy bandgap can be adjusted from 0.8 microns to 25 microns by adjusting the ratio of Hg to Cd. A potential tuning range is between 3 microns and 10 microns, as shown in dotted lines in FIG. 3A. Within this range the harvested energy for different harvest efficiencies, as a function of the temperatures, is shown in FIG. 3B. If 30% efficiency harvesting is achieved, 125 watts per square meter is harvested. This harvest capability translates to 0.125 mwatt per square millimeter. For example, the area of a circular harvest device that fits into the 11 mm diameter capsule would be 9.5 mm×9.5 mm×3.14=283 square millimeters resulting in 35.4 mwatt harvested. This would supply substantial power to continuously charge the battery and have continuous capsule operation for tens of hours without battery replacement. The development of this harvesting device could also allow elimination of the batteries in the future if the capsule like electronics device, requirements will match harvested power.

Figure 3D:
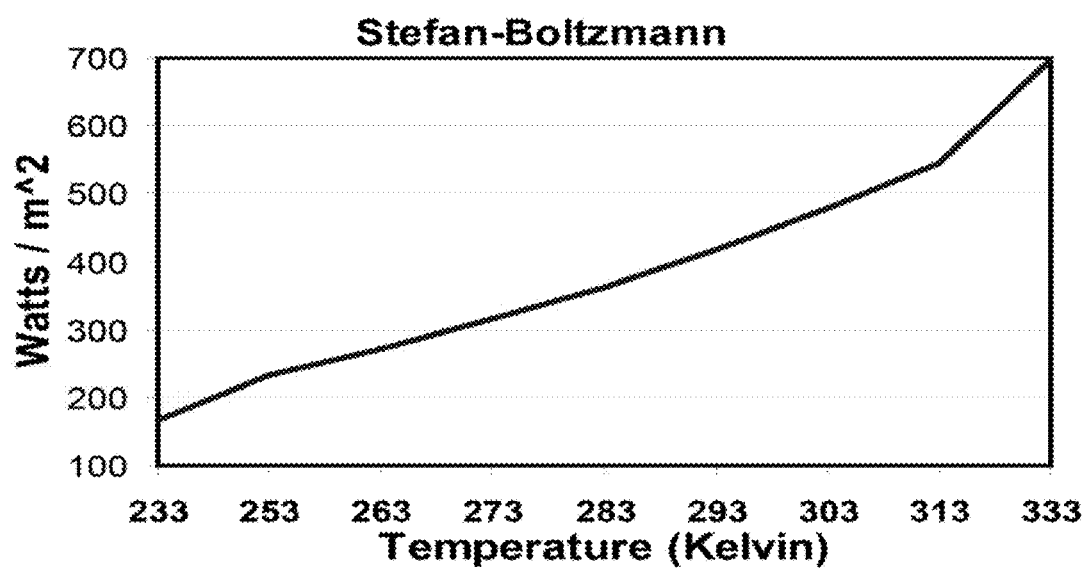
FIG. 3D is the Stefan-Boltzmann law calculating the total amount of available blackbody radiation at any temperature $5.67 \times 10^{-8} \times T^4$.

According to this invention, the maximum energy peak wavelength can be derived by determining the maximum energy wavelength of Planck's radiation law equation. The resultant maximum wavelength at maximum energy is hc/5kT=2897/T where T is temperature in degrees Kelvin. A plot of the equation (as shown in FIG. 2B) for the wavelengths versus temperature is shown in FIG. 3C and the maximum energy at a wavelength just above 9 microns can be shown for 310 Kelvin. Another well known equation is Stefan-Boltzman law that reduces to the equation $5.67 \times 10^{-8} \times T^4$. The Stefan-Boltzman law gives the entire amount of blackbody energy generated and available for harvesting at a specific temperature. At 310 degrees Kelvin as can be seen in FIG. 3D more that 500 watts per square meter is generated. There is a large amount of energy available. This amount can be compared to solar energy that reaches the earth at 1000 watts per square meter. The issue is how to harvest this energy at the longer infrared wavelength.

Figure 4A:
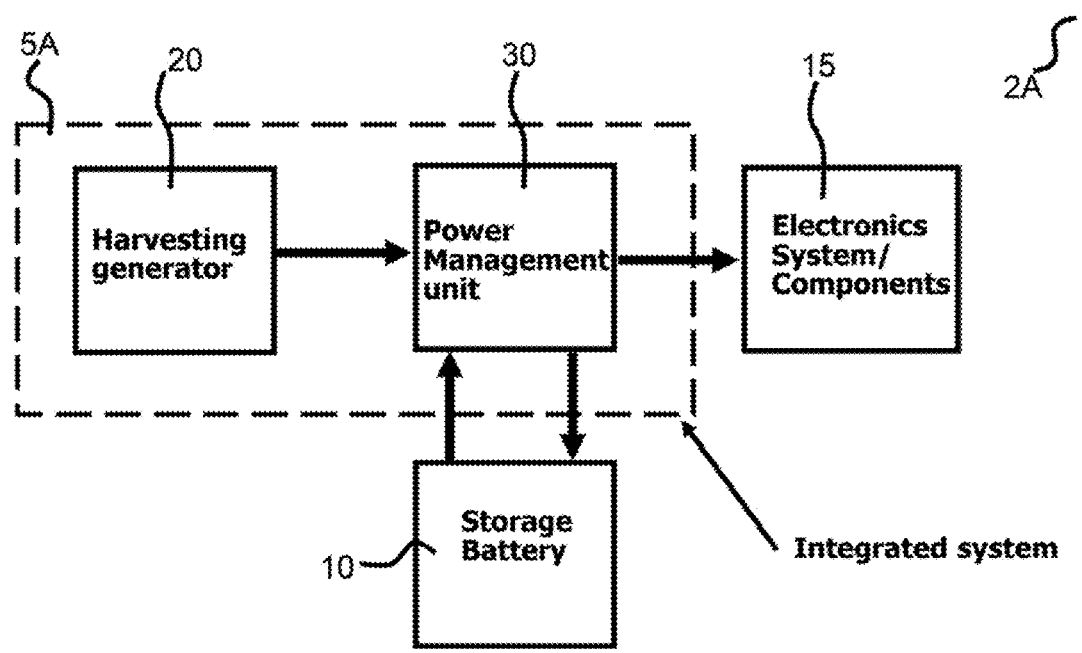
FIG. 4A is the schematic representation of the integrated harvesting unit and their interface with the battery and output device, in according to this invention.

Integrated Energy Scavenger with Energy Management:

FIG. 4A is the schematics showing the block diagram of the integrated scavenger unit, according to this present invention. The scavenger unit 2A comprises with the integrated system 5A, batteries 10, and out put device 15 (e.g. electronics system) to which energy is to be fed to. The integrated system 5A further comprises with energy harvester unit 20 and power management unit 30, which is designed to interface between the harvesting structure 20 and output device 15 which has to be included to have a useful harvesting solution. Power management devices 30 can be designed with current CMOS technology. To have versatile output voltage range, a 0.35 micrometer process with high voltage options up to 10 volts is used. This will allow internal harvested voltages to go beyond 3 volts and be regulated to a desired 3 volt output.

Figure 4B:
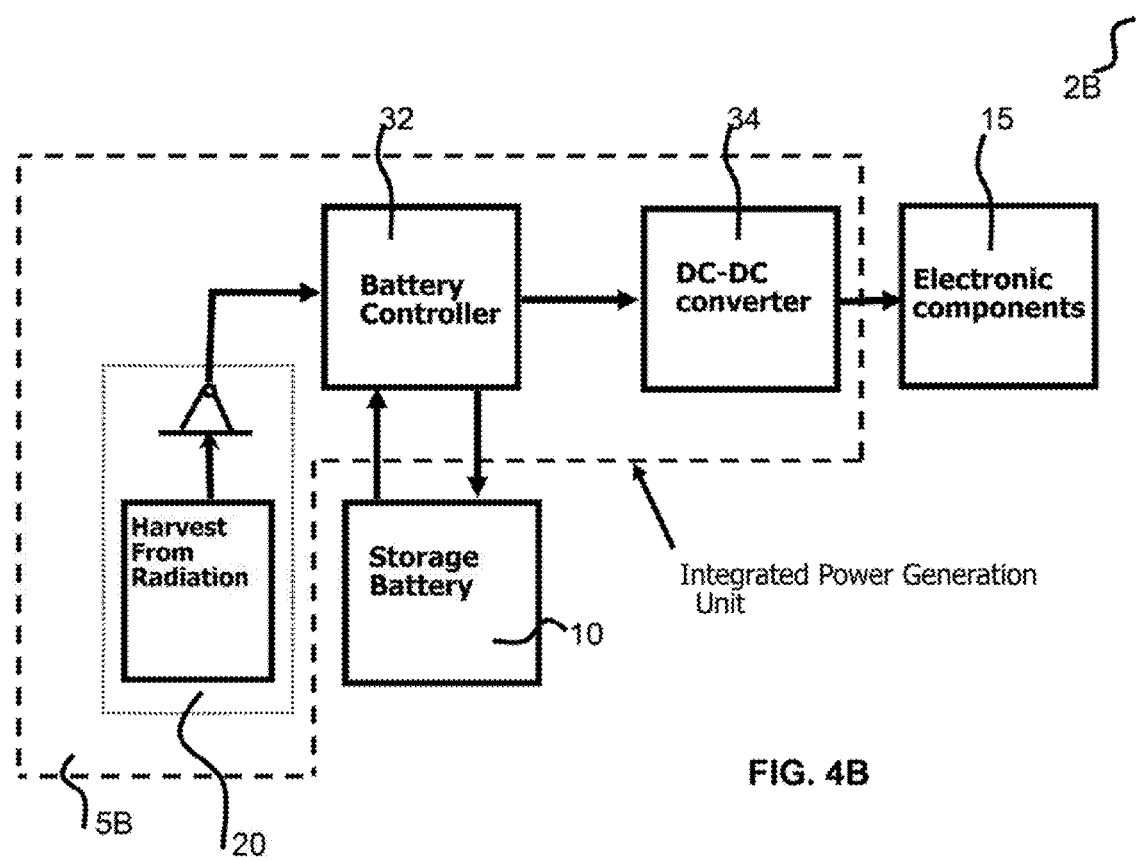
FIG. 4B is the schematic representation of alternative integrated harvesting unit and their interface with the battery and output device, in according to this invention.

FIG. 4B is the schematics showing the block diagrams of alternative integrated scavenger unit, according to this present invention, wherein similar numeral represent the same parts, so that repeated explanation is omitted herewith. The scavenger unit 2B comprises with the integrated system 5B, batteries 10, and out put device 15 (e.g. electronics system) to which energy is to be fed to. The difference between FIGS. 4A and 4B is the integrated system 5B (FIG. 4B), wherein the integrated system 5B further comprises with energy harvesting generator unit 20, battery controller 32, and DC-DC converter 34. The integrated harvesting unit is designed to have interface with the batteries 10 and output device 15, which has to be included to have a useful harvesting solution. Battery controller 32 and DC-DC converter 34 are designed with current CMOS technology. To have versatile output voltage range, a 0.35 micrometer process with high voltage options up to 10 volts is used. This will allow internal harvested voltages to go beyond 3 volts and be regulated to a desired 3 volt output.

According to this invention, the harvesting generator 20 scavenges the energy from the environment radiation and is operated in 24 hrs in a day and seven days a week (a.k.a. 24/7). Details of harvesting generator 20 is explained later.

According to this invention, the integrated unit 5A and 5B has the interface of battery 10 and the output device 15. Alternatively, the battery 10 can also be integrated with the integrated unit 5A or 5B (not shown here) and the integrated unit is having the interface with the output device 15. For this integration, thin film battery, is used.

Figure 4C:
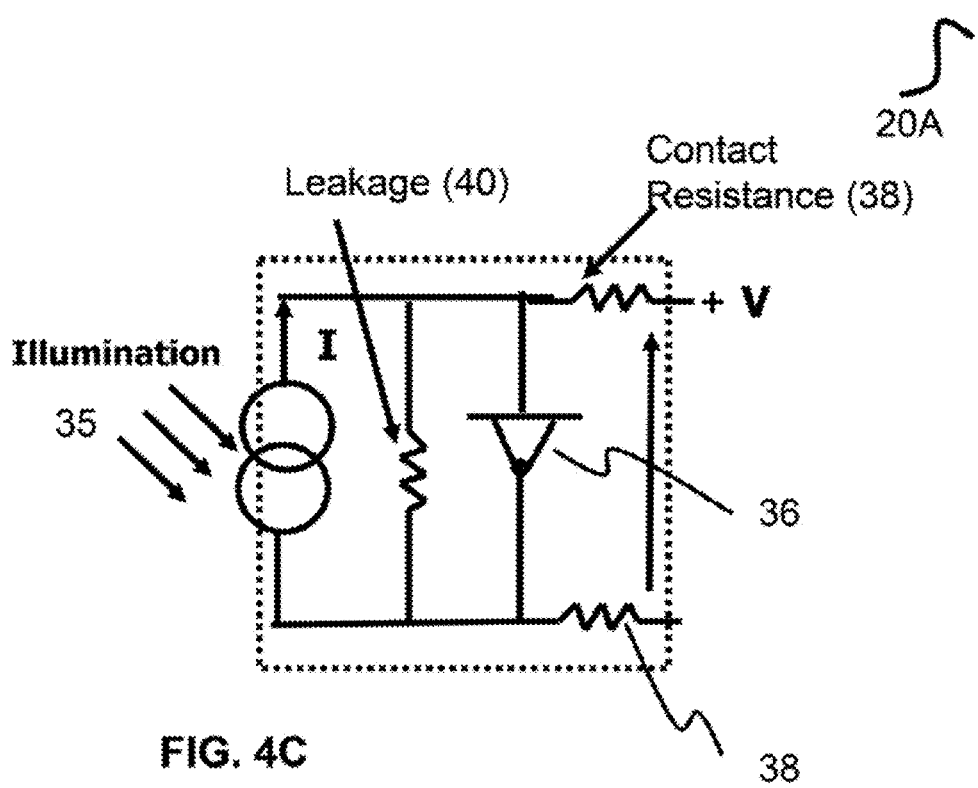
FIG. 4C is the schematic of harvesting diode, capable to scavenge energy from the radiation, in accordance to this present invention.
Figure 4D:
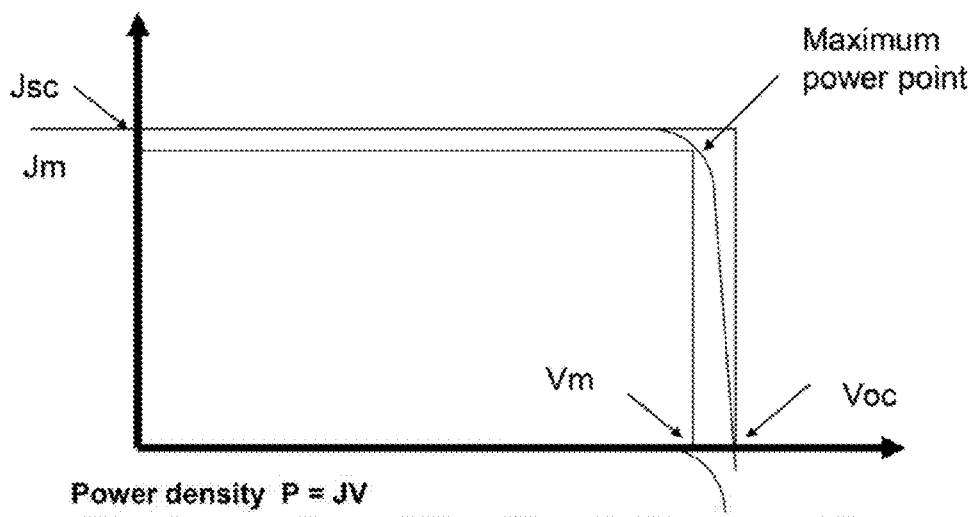
FIG. 4D is the typical current-voltage characteristics maximum available power versus ideal power unit.

According to this invention, a complete infrared harvesting system 20 to provide continuous power combines capability of a harvesting device 20 and a power management unit 30. The harvesting device 20 generates the necessary power to have continuous energy when generated power is greater than consumed power. A harvesting device 20, capable to scavenge energy from the environmental radiation, is that which comprises, either infrared radiation, and/or day-light radiation (could be solar and/or other day light). In the case of the radiation, combining with day and thermal radiations, the device (not shown here, but explained later) is integrated together so that the harvesting device 20 can generate energy both in day and night. The efficiency of this harvesting device 20 will be constrained by the same parameters of contact resistance, leakage current and dark current. FIG. 4C is the schematic showing the harvesting device 20A, consisting of at least one device which is a current generator that generates current from radiation (day-light, infrared, or both) photons 35, a diode representing dark current 36, and resistors representing contacts 38, and leakage 40. These non-ideal resistances degrade the performance of radiation harvesters. Total current generated is the current created by photon 35 conversion to electrons minus leakage current and diode dark current. The output voltage is reduced by voltage loss across the contact resistance. FIG. 4D shows the ideal harvesting curve and the realistic curve. The ideal curve is the maximum power that could be harvested. The realistic curve includes losses in harvest devices. Efficiency is the realistic current divided by the ideal current. The harvesting device 20 is connected to a power management 30 unit to create the power harvesting system 5 (5A or 5B). The power management 30 device will be developed with the same device aspect ratio as the energy harvesting device 20 so that the devices can be conveniently merged.

Figure 4E:
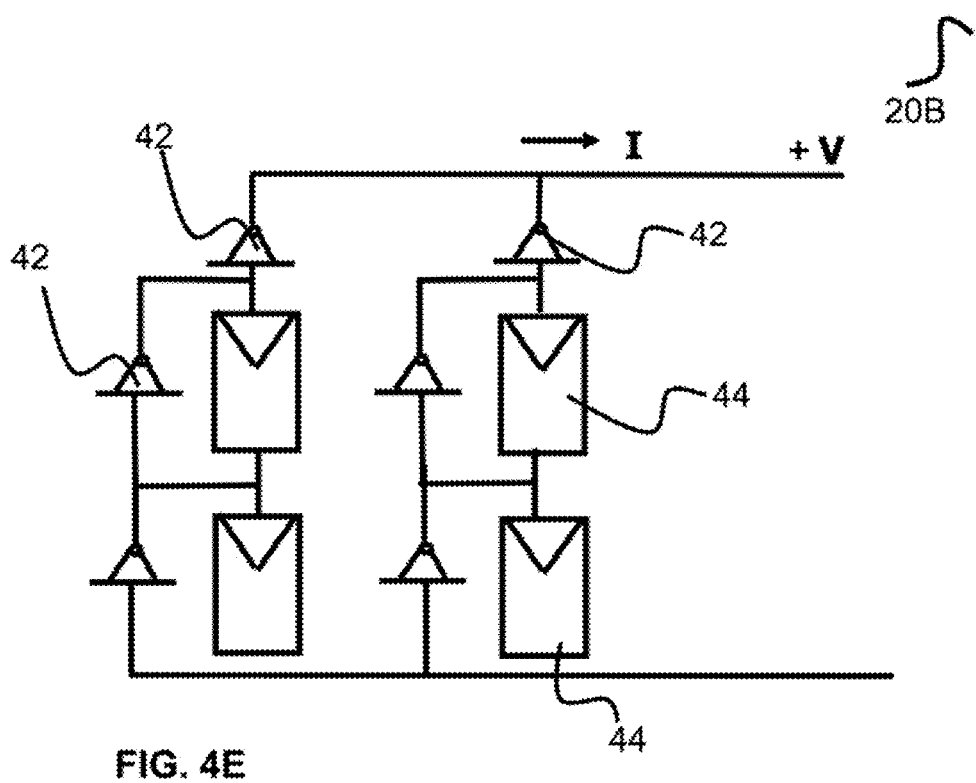
FIG. 4E is the schematic showing the interconnection of the diodes in the energy harvesting unit, in accordance with this present invention.

FIG. 4E is the schematic version of the integrated power harvesting device 20B, according to this invention, wherein same numerals represent the same parts so that repeated explanation is omitted herewith. The radiation (daylight, infrared, or combination of both) harvesting structure 20B comprises with the diodes 42 connected in series and parallel. The number of diodes 44 (generating the current and voltage) in parallel or series will depend on desired current and voltage. For example, the voltage in the case of the harvesting structure 20B is above 4 to 5 volts to compensate for drop across the protection diode and to give more headroom to the power management unit 30.

Figure 5:
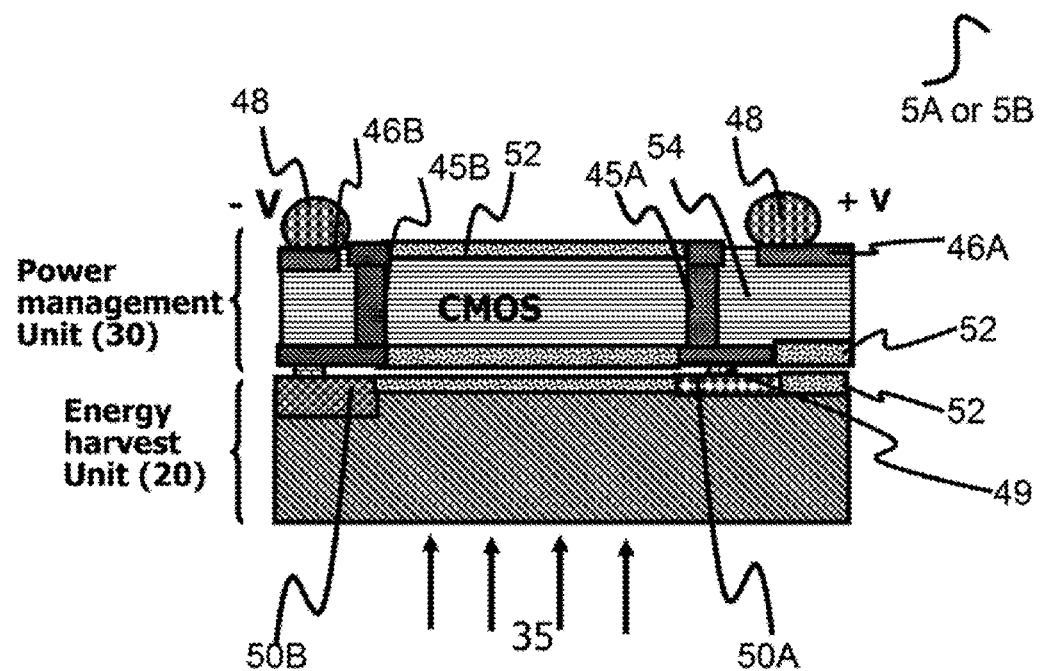
FIG. 5 is the schematic showing cross-sectional view of various components used as an example to make a scavenging device unit, in according to this invention.

FIG. 5 is the schematic showing cross-sectional view of various components used as an example to make integrated scavenging device unit, in according to this invention, wherein same numerals represents the like parts so that repeated explanation is omitted herewith. The integrated harvester unit 5 (5A or 5B) comprises with the power management unit 30 and energy harvesting unit 20, monolithically or hybridly integrated on the substrate. The power management unit 30 is fabricated either using the Si-technology utilizing standard CMOS process or flexible printed electronics technology. Alternatively, power management unit can be made from passive circuit comprising a capacitor to store the harvested energy. This power management unit 30 has circuits which can manage the energy generated by energy harvester 20, supplies the energy to the output device 15 (not shown here) and store/recharge the battery, when necessary. According to this invention, the power management unit 30 comprises with the integrated circuit (not shown here) and the contacts 46A and 46B, connecting to the energy harvester 20 via 45A and 45B and via bumps 48.

According to this invention, the energy harvesting unit 20 is the semiconductor devices, based on p-i-n or p-n junction (or n-i-n or p-i-p), capable to generate energy from the environment radiation (either day or thermal radiation). The energy harvesting unit 20 comprises with at least one semiconductor junction (not shown here), two contacts 50A and 50B, acting as the positive and negative electrodes, and the contacts help to connect with the power managing unit 30, through bumps 49. The contacts 50A and 50B, and 46A and 46B and 45A and 45B, are isolated by insulator layer 52. For scavenging energy from the day light, harvesting generator 20 is made from Si, amorphous-silicon, Si:Ge, GaN, GaAs, InGaAs, InP, CdTe/CdS, or polymer can be materials. For scavenging energy from infrared radiation, the harvesting generator 20 is made from InGaAs, InP, InSb, or HgCdTe material or their based materials. Radiation 35 (either daylight or infrared) is illuminated (or incident) from the back side of the harvesting generator. For the HgCdTe based harvesting generator made on Silicon/CdTe, infrared radiation as low as 3 to 15 micrometer can be absorbed without thinning out the substrate. Radiation energy with wavelengths greater than 3 microns pass through the silicon/CdTe and are captured and converted to electrons by HgCdTe. If the Si/CdTe are thinned out or the HgCdTe p-n junction only transferred to the third substrate (not shown here), radiation as low as visible to as high as 15 micrometer wavelengths can be absorbed, and it generates the energy day and night both.

According to this invention, the devices 20 and 30 are stacked with electrical connects made with bumps (e.g. Indium). Vias 54 through the CMOS power management system 30 brings power connections to the power harvester 20. Radiation 35 is focused from the silicon/harvesting generator side.

According to this invention, thinning of silicon for the case HgCdTe based harvesting generator fabricated on Silicon/CdTe allow infrared to pass but has a transmittance of about 50%. This energy harvesting system is also alternatively connected to a metal support (not shown here) that connects to the top side of the battery.

Figure 6A:
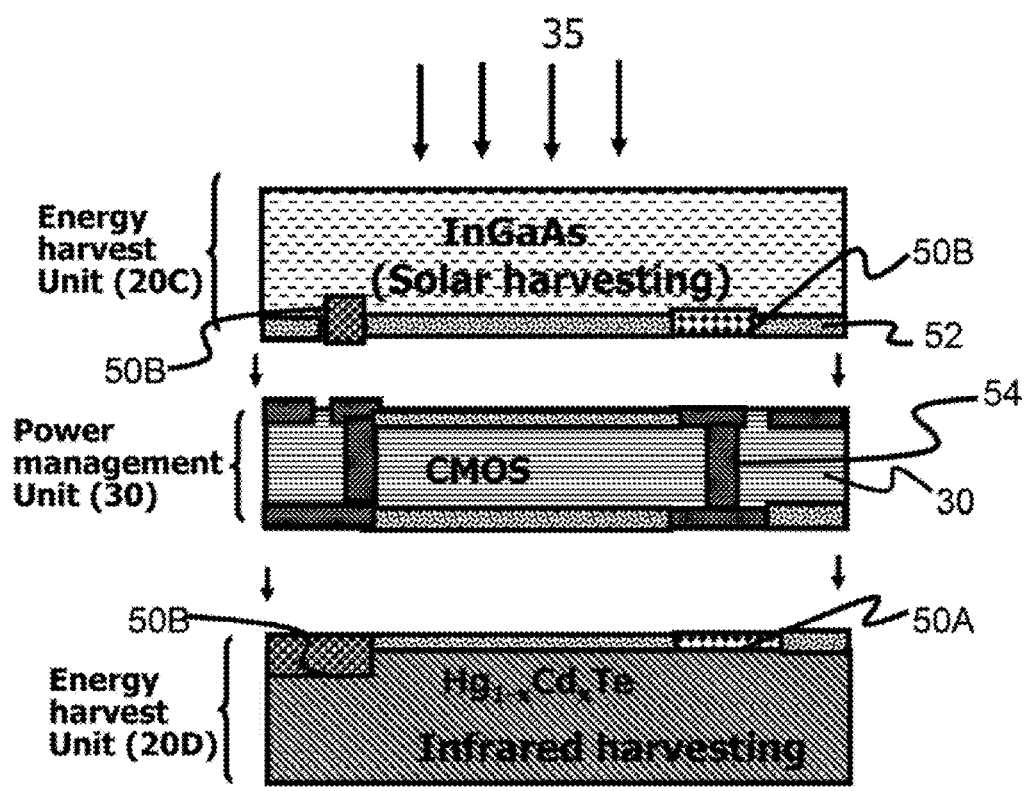
FIGS. 6A and 6B are the schematics showing the cross-sectional views of various components used to complete alternative energy scavenging device unit, in according to this present invention.
Figure 6B:
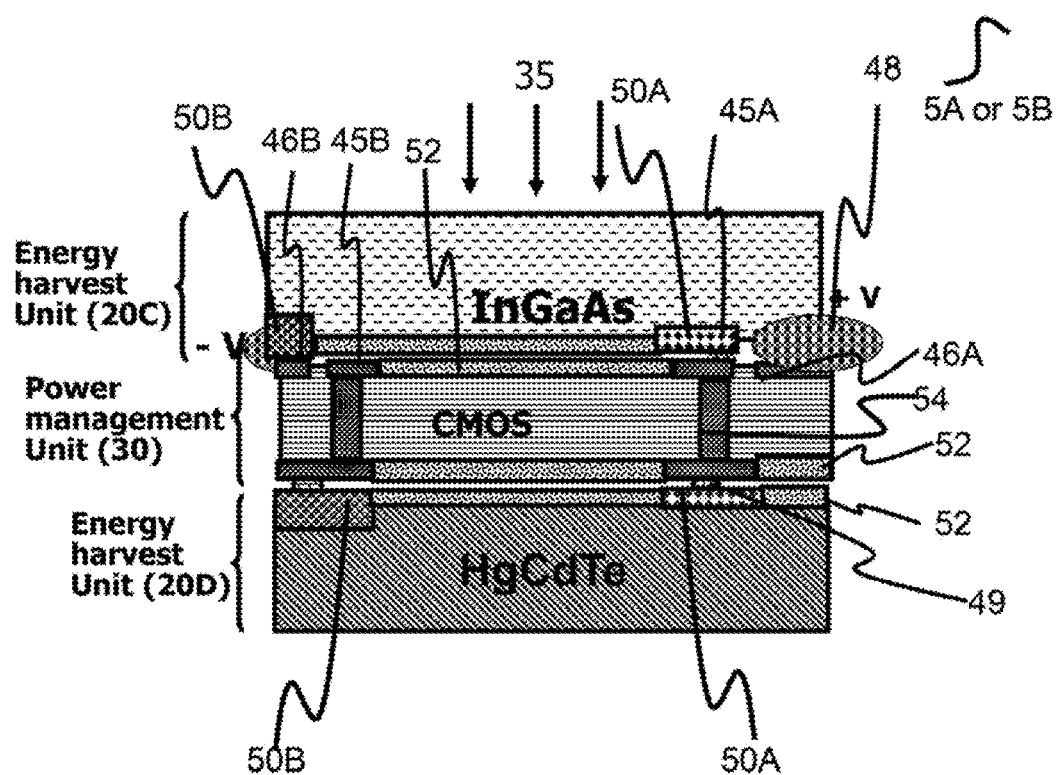

FIGS. 6A and 6B are the schematics showing cross-sectional views of various components used as an alternative example to make integrated scavenging device unit, in according to this invention, wherein same numerals represents the like parts so that repeated explanation is omitted herewith. According to this invention, the integrated harvesting unit 5A or 5B comprises with two harvesting generators 20C and 20D and the power management unit 30, wherein harvesting generator 20C is capable to scavenge the energy from the day light or sun light and the harvesting generator 20D is capable to scavenge the energy from the infrared radiation 35, especially extending from 1 micron to 15 micron. Both harvesting generators 20C and 20D are attached with the Si-based power management unit 30 in a way that harvesting generator 20C is bonded on the top side of the power management unit 30, and harvesting generator 20D is bonded directly at the bottom of the power management unit 30. According to this invention, the radiation extending from UV to infrared makes incident to the top of the harvesting generator 20C, wherein near UV to short-wave infrared (i.e. 2 micrometer or 2.5 micrometer) are absorbed by the harvesting generator 20C, and the rest of other wavelengths are absorbed by the harvesting generator 20D.

According to this invention, the harvesting generator unit 20C is fabricated from Si, amorphous silicon, Si:Ge, InP, InGaAs, GaN, polymer material, and the harvesting generator 20D is made from HgCdTe based material. They are attached with the power management unit 30 either directly with their substrate, or substrate or any absorbing layer (e.g. substrate) can be taken or thinned out before to attachment.

According to this invention, connection of diodes in parallel and series are with metal connections on the top of the energy harvesting device 20 (not shown here). A schematic representation of this diode connection is shown in FIG. 4E.

Scavenging Generator

In this section several exemplary methods of construction will be described for illustrative purposes. In particular, hybrid harvesting generator structure and methods of construction for the exemplary shown in FIGS. 7 to 10B are shown.

Figure 7:
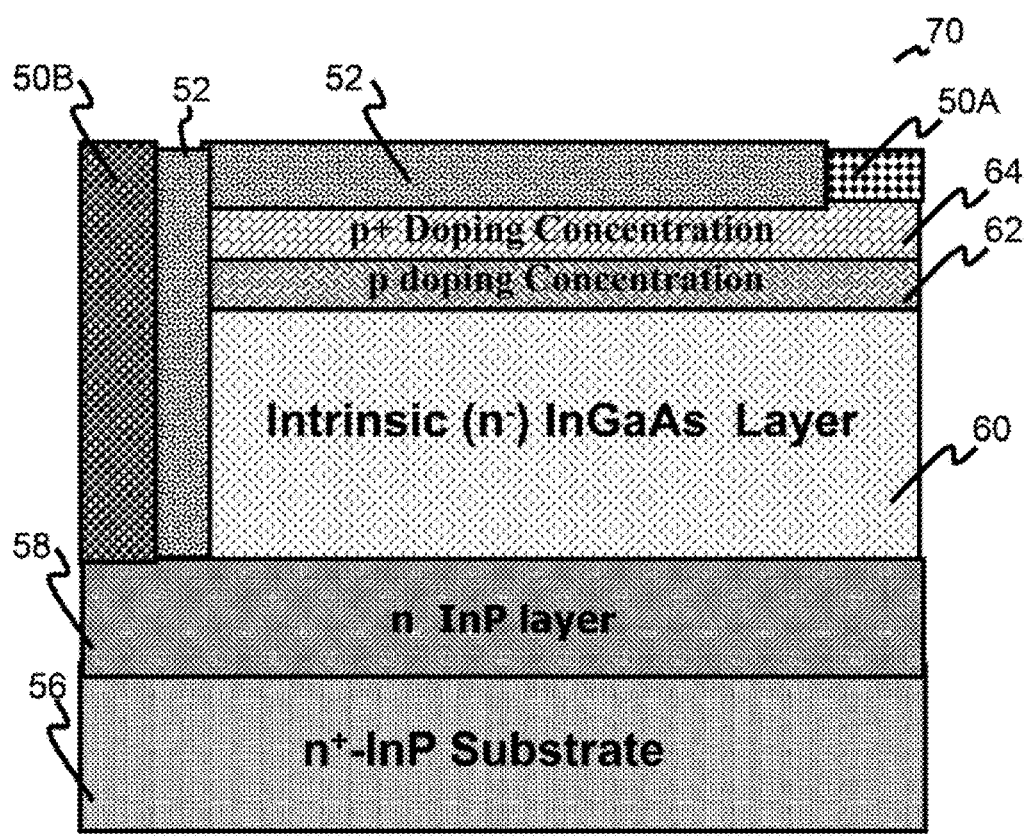
FIG. 7 is a schematic showing the cross-sectional view of a hybrid device, capable to harvest the energy during day time, according to this invention.

FIG. 7 is the schematic showing cross-sectional views of enlarged portions of the harvesting generator, made from semiconductor as an example to make integrated scavenging device unit, in according to this invention, wherein same numerals represents the like parts so that repeated explanation is omitted herewith. According to this invention, the harvesting generator comprises with the InP as the substrate 56, InP buffer layer 58, InGaAs absorption layer 60, multiple p-doping layers 62 and 64, electrodes 50A and 50B, insulator 52. At least one or no layer is used for interface of two dissimilar materials (not shown here). Either complete substrate 56 and buffer layer of InP 58 or portion of those layers are thinned out prior to attachment. These layers are grown using standard metal-organic chemical vapor deposition (MOCVD) techniques. Appropriate dopants are used to make the device structure appropriate for harvesting energy from day light and short-infrared wavelengths. The device 70 with appropriate metal interconnection makes the harvesting generator 20.

Figure 8:
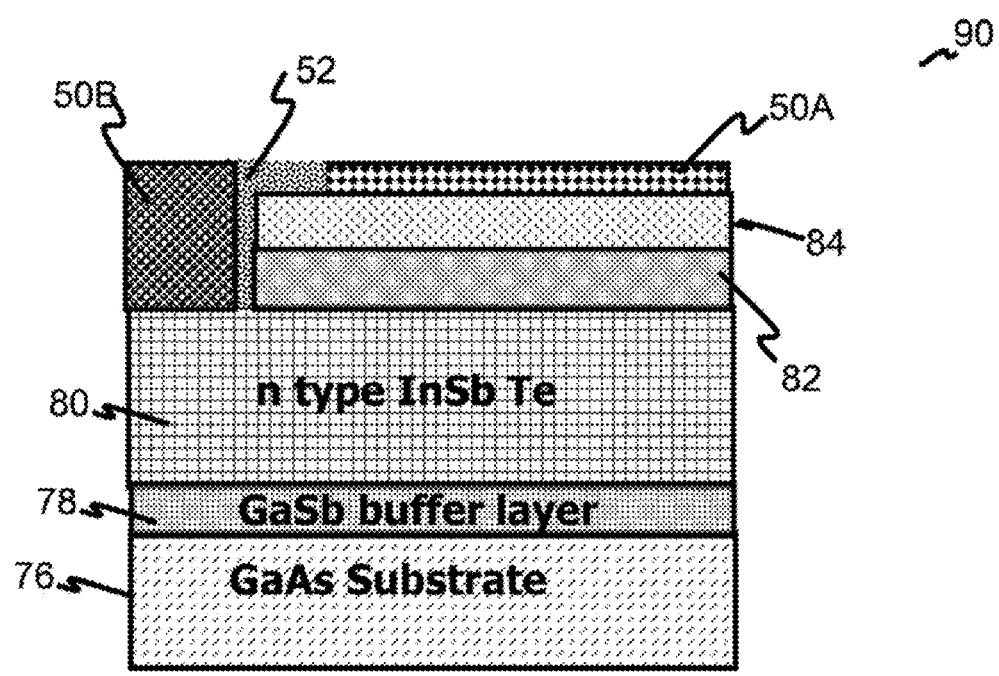
FIG. 8 is a schematic showing the cross-sectional view of a hybrid device, capable to harvest the energy from 3 to 5 micrometer radiation, according to this invention.

FIG. 8 is the schematic showing cross-sectional views of enlarged portions of the harvesting generator, made from semiconductor as an example to make integrated scavenging device unit, in according to this invention, wherein same numerals represents the like parts so that repeated explanation is omitted herewith. According to this invention, the harvesting generator comprises with the GaAs as the substrate 76, GaSb buffer layer 78, InSb:Te absorption layer 80, multiple doping layers comprising with p or n type or their combination layers 82 and 84, electrodes 50A and 50B, insulator 52. At least one or no layer is used to interface two dissimilar materials (not shown here). Either complete substrate 76 and buffer layer 78 or portion of these layers are thinned out prior to attachment. These layers are grown using standard metal-organic chemical vapor deposition (MOCVD) techniques. Appropriate dopants are used to make the device structure appropriate for harvesting energy from day light and short-infrared wavelengths. This device 90 with appropriate metal interconnection makes the harvesting generator 20. According to this invention, doping layers 82 and 84 are InSb layers, doped with either Te or Sb, or both layer types. For the sake of example not for limiting the invention, the layers 82 and 84's thickness can be varied from 0.1 micrometers to 3 micrometers.

Figure 9:
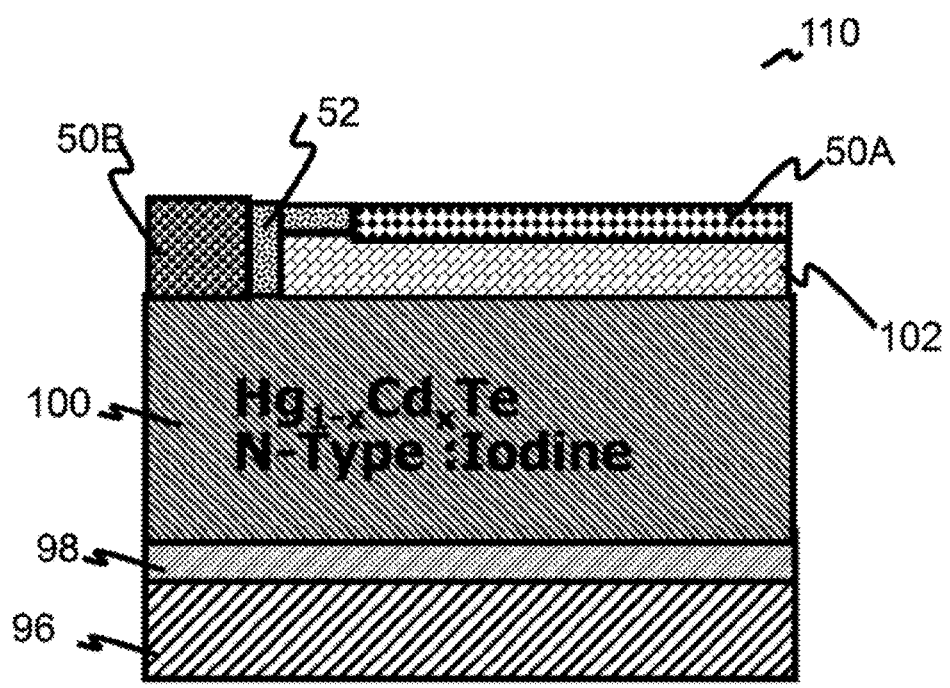
FIG. 9 is a schematic showing the cross-sectional view of a hybrid device, capable to harvest the energy from 3 to 15 micrometer radiation.

FIG. 9 is the schematic showing cross-sectional views of enlarged portions of the harvesting generator, made from semiconductor as an example to make integrated scavenging device unit, in according to this invention, wherein same numerals represents the like parts so that repeated explanation is omitted herewith. According to this invention, the harvesting generator comprises with the silicon as the base substrate 96, CdTe buffer layer 98, HgCdTe:Te absorption layer 100, multiple doping layers comprising with either p type layer only, or n type layer only 102, electrodes 50A and 50B, insulator 52. At least one or no layer is used to interface two dissimilar materials (not shown here). Either complete substrate 96 and buffer layer 98 or portion of these layers are thinned out prior to attachment. These layers are grown using standard metal-organic chemical vapor deposition (MOCVD), sputtering, or molecular beam epitaxy (MBE) techniques. Appropriate dopants are used to make the device structure appropriate for harvesting energy from day light and short-infrared wavelengths. This device 110 with appropriate metal interconnection makes the harvesting generator 20. According to this invention, doping layer(s) 102 is HgCdTe layer doped with As making p-type layer. For the sake of example not for limiting the invention, the layer 102 thickness can be varied from 0.01 micrometers to 3.0 micrometers.

Figure 10A:
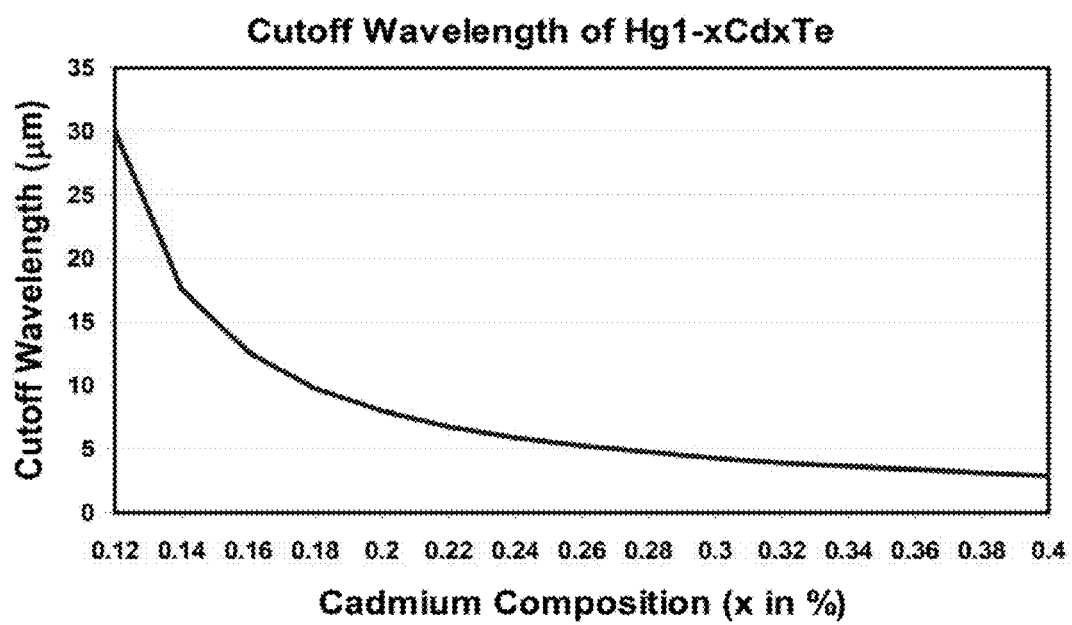
FIGS. 10A and 10B are the wavelength adjustment as the function of Cd contents, and quantum efficiency of the hybrid device capable to harvest from 3 to 15 micrometer wavelengths radiations, according to the principles of this invention.
Figure 10B:
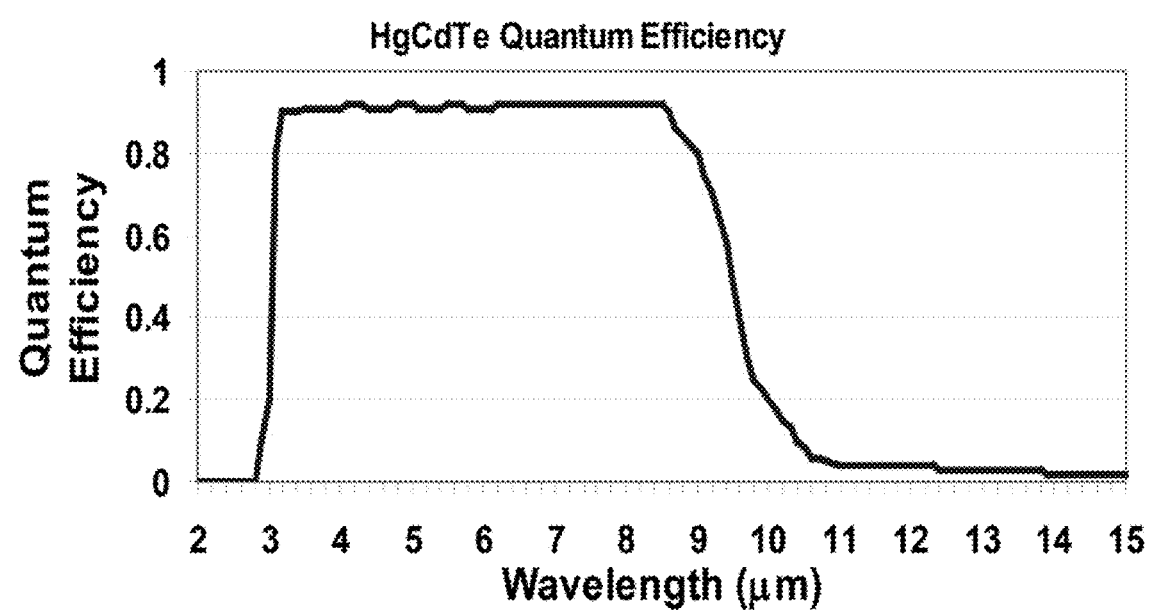

According to this invention, Mercury Cadmium Telluride (HgCdTe). HgCdTe's bandgap is tuned between 0.8 to 25 micrometer. HgCdTe has been applied to infrared sensing since the early 1970's. Bandgap can be adjusted by varying the percentage of Hg versus Cd. The equation showing this relationship is $Eg=-0.302+1.93x-0.81x^2+0.832x^3+(5.35\times 10^{-4})T(1-2x)$ where x is the amount of cadmium. This equation is plotted in FIG. 10A. Adjustment of cadmium versus mercury can result in a reasonable implementation that has the ability to harvest wavelengths from 3 to 10 micrometer. The upper limit of 10 micrometer is chosen to maintain a reasonable forward voltage. The amount of energy harvested in the range of 3 u to 10 u is shown in FIG. 3B. The amount of energy to be targeted is 80%. There are several factors that contribute to infrared harvesting efficiency. The ability of a material of absorb energy in the wavelength of available energy is a key factor. This key factor determining the net conversion efficiency of solar cells is quantum efficiency (QE). (QE) is the probability that an incident photon of energy E will deliver an electron to the external circuit. QE varies per wavelength for different solar harvesting technologies. The QE for HgCdTe with a bandgap adjusted to 10 u versus wavelength is shown in FIG. 10B. Other factors affecting conversion efficiency are cell layer thicknesses, contact resistances and leakages. According to this invention, the harvesting generator unit 20, alternatively manufactured utilizing HgCdTe on a silicon substrate with a deposited layer of CdTe. The CdTe is a buffer layer to reduce stress between the silicon substrate and HgCdTe substrate. Doping with iodine creates n-type HgCdTe. Doping with arsenic creates the p-type HgCdTe. Metal ohmic contacts are made to the n-type and p-type devices on the top side. Illumination is from the bottom silicon side. All infrared wavelengths between 3 u and greater than 10 u will pass through the silicon CdTe substrate. 3 micrometer wavelength energy does not pass to the HgCdTe since it is absorbed by the CdTe. To achieve the bandgap upper limit of 10 micrometer, 17% Cadmium versus 83% mercury is used. Once energy is harvested, conditioning of that energy must be done to supply voltage and current to devices and charge batteries. A power management unit designed to interface between the infrared harvesting structure and output device is included to have a useful harvesting solution. As mentioned before, power management devices can be designed with current CMOS technology. To have versatile output voltage range, a 0.35 micrometer process with high voltage options up to 10 volts would be used. This will allow internal harvested voltages to go beyond 3 volts and be regulated to a desired 3 volt output.

Figure 11A:
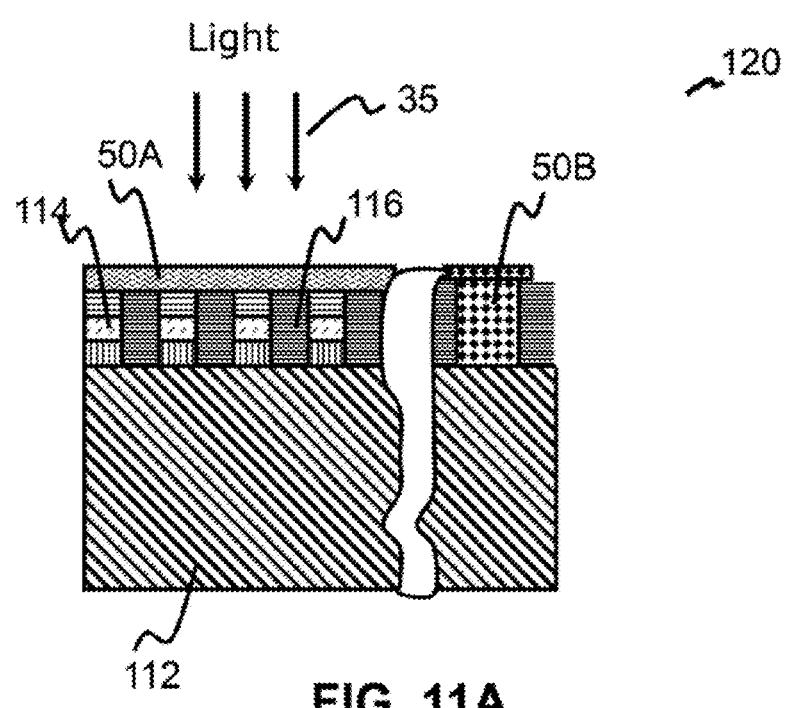
FIGS. 11A and 11B are the schematics showing the cross-sectional views of alternative harvesting generator unit, an integral part of the integrated harvesting unit, in accordance to the present invention.

FIG. 11A is the schematic showing the enlarged view of the cross-sectional views of the harvesting generator device (hybrid), in accordance with this invention, wherein the like numerals indicates the like parts, so that repeated explanation is omitted here. Harvesting generator device 120 alternatively comprises with multiple nano-scaled 3-D blocks 114, receiving all wavelength of the light 35 and also absorbing the light with higher wavelengths capability than its macro-bulk material, spacer material 116 in between two 3-D blocks 114, metal contact 50A, and common metal contact 50B. Utilizing the nano-scaled 3-D blocks, it is possible to make the harvesting generator device more broader absorption spectrum and its broadness is dependent on the diameter, and space of the nano-scaled blocks 114. For example, if the InGaAs (lattice matched to InP) 3-D blocks 114 of diameter 100 nm or so is used as an absorption layer (not shown here), and a ohmic contact layers which do not absorb significant number of photons, the absorption spectra can be extended from 1700 or 2500 nm to Mid-IR. Bulk (macro) InGaAs layer has the absorption edge in the vicinity of 1700 nm and with changing the contents, absorption spectra can be extended to 2500 nm, beyond of that it is not possible if the bulk InGaAs is used as the absorption layer. In addition, utilizing the 3-D blocks the reflection of the radiation is made to zero and all wavelengths can be absorbed, if the harvesting generator device 120, is well designed and well optimized.

Figure 11B:
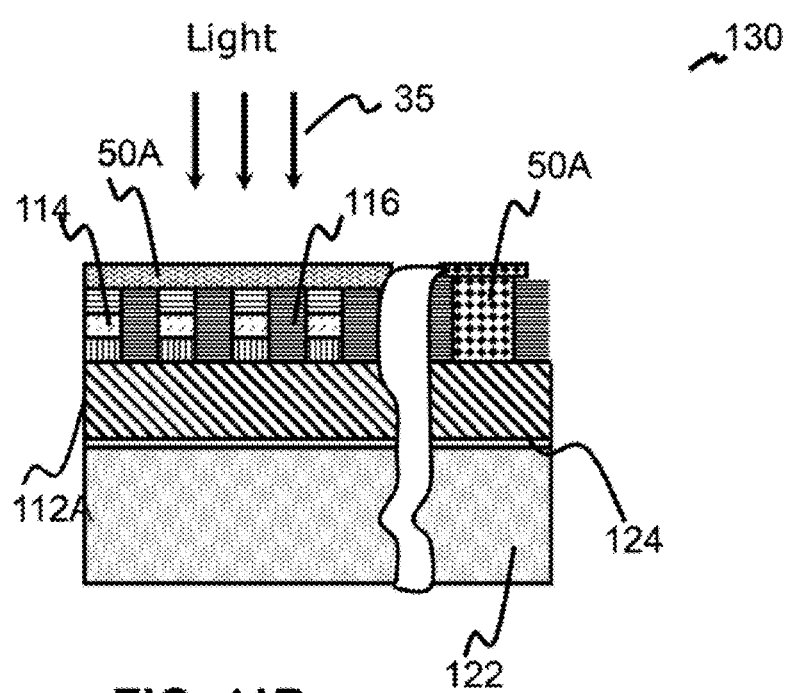

FIG. 11B shows the schematics showing the cross-sectional views of alternative harvesting generator having wide spectral detection ranges in accordance with the present invention, wherein the same numerals are the same parts so that repeated explanation is omitted here. Only difference with FIGS. 11A and 11B is that, substrate 112A is thinned out prior to the process and thinned substrate 112A is attached with the foreign carrier substrate 122 (e.g. metal or glass, or semiconductor) using the adhesive 124. The foreign substrate 122 either takes out or remains with the thinned substrate after the harvesting generator device is made.

According to this present invention, substrate materials can be chosen from the groups of material consisting of InGaAs, GaAs, Si, Si:Ge, HgCdTe, InSb, GaN, and InP. The absorption layer, especially forming p-in or p-n junction in 3-D blocks can be chosen, especially InGaAs, HgCdTE, InSb, Si, a-Si, Si:Ge, InGaP, CIGS, CdTe etc.

Thinning Out Substrate for Harvesting Generator Device

From FIGS. 5 to 11B, it is mentioned that the substrate can be thinned out either prior to the fabrication process to make the harvesting generator device, or after the fabrication process. In the case of thinning out (here after mentioned as Thin-Cut process) the substrate, the process described can be used according to this invention. This follows the standard fabrication to make the harvesting generator.

Figure 12:
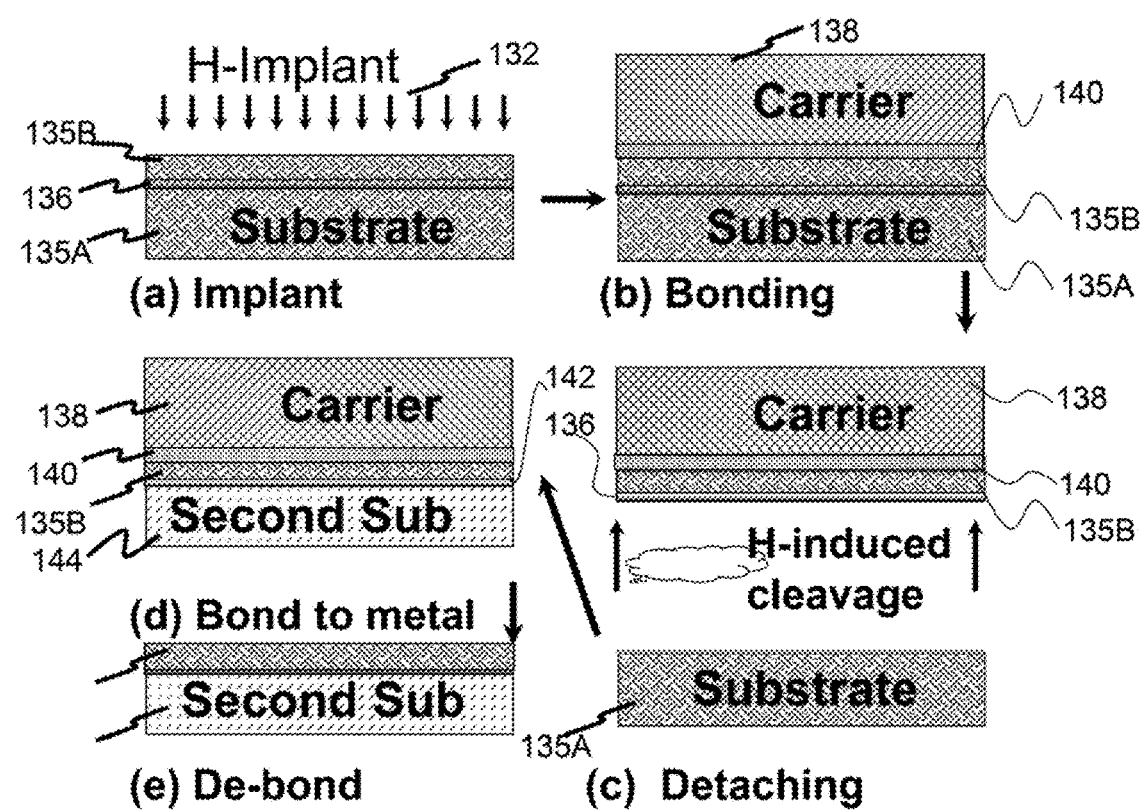
FIGS. 12 (a) to (e) are the schematics showing the cross-sectional views of a substrate thinning process, according to this invention.

FIGS. 12 (a) to (e) are the cross-sectional views representing the process flow for the thin-cut process for substrate thinning-out, according to this invention, wherein the like numeral represents the like part, so that repeated explanation is omitted here. H+ ions 132 are implemented into semiconductor substrate 135 (i.e. InP, Si etc.). Different doses with beam currents can be used, which is dependent on the thickness of the thin-cut of the substrate 135 is necessary. H+ ions implant divides two layers inside substrate makes the two layers 135A and 135B inside the substrate, having interface of 136. This is followed by the attaching of the carrier substrate 138 with the help of the interface layer 140, which is adhesive. For carrier substrate 138, glass can be used and this is attached with the help of adhesive as the attachment layer 140. As adhesive, Microchem SU can be used, especially, after going through cleaning process with acetone and water, adhesive like, Microchem SU is spun onto the carrier substrate 138 and bonded onto the implemented substrate 135B. Temperature or UV treatment, or both can be applied in bonding process. This is followed by detaching the thinned implemented substrate 135B from the main substrate 135A, with the help of applying the heat at certain temperature. Adhesive 142 is coated onto the implanted substrate layer 135B to bond with the foreign substrate 144 and is annealed at the temperature which is extend from 100 C to 300 C. By this temperature, SU gets soften and the carrier substrate 138, used as the handle can be taken out. Later, oxygen plasma can be used to clean the residual of Su bonding. According to this invention, this substrate material covers all semiconductor, such as InP, Si, GaAs, InGaAs, InSb etc.

According to this invention, the harvesting generator described from FIGS. 7 to 11B, may construct from the thinned substrate which can be thin-cut, using the process mentioned above.

It should be understood that variation in the device structure shown in FIGS. 5 to 9 are well within the scope of the invention. However, the variation in design is well within the scope of the invention. In all other respect the hybrid device shown in FIGS. 7 to 9 are substantially similar discrete devices used in FIGS. 5 to 6 to make the integrated harvesting unit.

It can be appreciated that the sequence of layers described here (in FIGS. 7 to 10B) are merely illustrative and may be altered according to the number of sections required in the harvesting generator (20) device in various embodiments of the invention. For example, FIGS. 7 and 8 are fabricated on the substrate such as n-type InP and GaAs substrate, illustrate the basic structure of the harvesting generator device that makes reverse type of semiconductor. For example, device can be made utilizing the p-type substrate. For convenience, like parts are indicated by like reference numerals, and in each step only the section constructed in that step is indicated. A method of constructing each step may be similar or different from the one used in the counterpart steps described in reference with FIG. 7, depending upon the exact details of the structure being constructed.

Those skilled in the art will appreciate that by carefully selecting the parameters of the harvesting devices, the device constructed according to the principles of the invention has a number of advantages including but not limited to, a) utilizing a wider section of the radiation, b) providing the capability to harvest energy in 24/7 operation. As a result, efficiency of the hybrid Solar cell device is higher as compared to a prior art planar solar cell device shown in FIG. 3.

In order to have a wider choice of materials for constructing the hybrid device it is desirable to relax the compatibility requirement. In an alternative embodiment, all the semiconductor material having absorption capability of certain radiation used for the harvesting generator are an integral part of the complete harvesting unit. In that case, simplified hybrid devices may be constructed resulting in two different embodiments, schematically shown in FIGS. 7 to 9, where like parts are indicated by like reference numerals.

Those skilled in the art will appreciate that the design choices described in the embodiments are only illustrative and other variations to the design may be made without deviating from the basic principles of the invention. It can be further appreciated that without deviating from the principles of the invention, the exemplary embodiments described earlier may be altered such that the incident photon flux illuminates the solar cell devices from the top surface instead from the bottom surface. It can also be appreciated that the choice of materials to construct the exemplary embodiments are not limited to the specific materials described therein and may be altered for different illumination schemes, different construction processes, and compatibility with other steps involved in constructing the hybrid device. Many other design choices that may be made to optimize the performance of the hybrid devices without deviating from the basic principles of the invention will now be discussed.

The choice of materials is one of many important aspects in constructing a harvesting generator according to the principles of the invention. Methods to construct different sections of the devices that are well known and well documented in the art include but are not limited to, physical vapor deposition such as, sputtering, vacuum thermal evaporation, chemical deposition such as, chemical vapour deposition (CVD), metal-organic chemical vapour deposition (MOCVD), epitaxy, electroplating, electrolysis plating and a combination of these methods thereof. Those skilled in the art know that these methods are selected depending upon individual sections to be constructed and materials utilized in constructing individual sections of the hybrid device. Compatibility between the selected method and material for each section is very important. It is also important that methods of construction and materials utilized for individual section are compatible with the construction of other sections. All these and other criteria are well documented in the art and will not be discussed further.

Different combination of materials may be utilized depending upon the illumination scheme (for example, radiation wavelengths available), compatibility with the sections to be constructed in each layer used to construct the harvesting devices (e.g. 70, 90, 110), and the methods to be utilized for the construction. Referring again to FIGS. 7 to 10B, the substrate (301) is the one selected from glass, sapphire, ceramic, semiconductor or polymer.

The substrate may be uniform or may include special surface features, such as grooves, that may be necessary to construct the next section overlying the substrate. Choice of top or bottom illumination scheme is another important factor that governs the selection between a transparent, opaque or semi-transparent substrate. As mentioned earlier, the methods for constructing the hybrid harvesting generator devices are well known to those skilled in the art and the illustrative examples described here are merely guidelines for constructing a harvesting generator device according to the principles of the invention.

Different materials that can be utilized for the first and second electrodes namely, the transparent conducting layer (50A) and the metal layer (50B) include but are not limited to materials well known in the art such as, conducting transparent oxides (CTO) including indium tin oxide (ITO), metals including gold, silver, platinum, palladium, titanium zinc, and their alloys, refractory materials including tungsten, molybdenum, tungsten silicide, etc.

Construction of the device structure utilizes materials that include but are not limited to, semiconductors, or photosensitive polymers that are well known in the art. The semiconductors include but are not limited to, single crystalline, microcrystalline, polycrystalline or amorphous forms of elemental semiconductors, crystalline III-V alloy semiconductors, crystalline, polycrystalline or amorphous II-VI alloy semiconductors. They may be thin films or epitaxial layers. The specific materials and their forms in these categories are well documented in the art, and are too numerous to list here. For example, the all materials (from 56-64) shown in FIG. 7 may be constructed from c-Si, micro-Si, poly-Si, and a-Si. Alternatively, they may be constructed from III-V alloy semiconductors such as GaAs, InP, GaAlAs, GaInAsP, GaInAs, or any combination thereof, or they may be constructed from a photosensitive polymer.

The device structure for the harvesting generator (20) may be constructed either along with the rest of the device or it may be pre-fabricated on a foreign substrate and transferred to the substrate on which the device is being constructed. Either way, all the materials listed for constructing the matrix may be used to construct the device structure. However, for maximizing the benefits of the structural aspects of the invention thereby improving the efficiency.

Those skilled in the art will appreciate that within this framework of selecting different materials and processes for constructing the hybrid device, many variations are possible that are too numerous to list here. It should be understood that the efficiency of the harvesting generator is high due to a combination of the material chosen to absorb all radiation wavelengths in the devices constructed from a different material exhibiting photovoltaic effect, and the distinguishing structural aspects.

While the choice of materials is important structural aspects of the hybrid device also play an important role in improving the absorption of light over a larger section of the radiation spectrum, reducing the reflection loss at the surface, enhanced surface area for better collection and absorption of light, enhanced photo-carrier generation, better separation of photo-carriers assisted by the built-in field of the surface junctions, longer diffusion length of photo-carriers in the absorption layer, and efficient collection of the photo-carriers at the respective electrodes.

The full extent of these and other advantages of the hybrid harvesting generator device constructed according to the principles of the invention can be appreciated.

What is claimed is:

1. An energy generating device comprising:
   a daylight energy harvesting unit;
   a power management unit located in close physical proximity to and electrically connected to said daylight energy harvesting unit; and
   an infrared energy harvesting unit located in close physical proximity to and electrically connected to said power management unit;
   wherein said power management unit consists of a CMOS-based integrated circuit configured to manage and control the energy scavenged by said energy harvesting unit such that said power management unit regulates voltage output, wherein said power management unit comprises at least one capacitor for temporarily storing energy;
   wherein said daylight energy harvesting unit and said power management unit are bonded so as to be discretely integrated;
   wherein said infrared energy harvesting unit and said power management unit are bonded so as to be discretely integrated;
   wherein said daylight energy harvesting unit is stacked above said power management unit, and said power management unit is stacked above said infrared energy harvesting unit;
   wherein said daylight energy harvesting unit comprises an absorption material selected from the group consisting of Si, amorphous silicon, Si:Ge, GaN, GaAs, InGaAs, InP, CdTe, CdS, and polymer; and
   wherein said infrared energy harvesting unit comprises an absorption material selected from the group consisting of InGaAs, InP, InSb, and HgCdTe.

2. The energy generating device of said 1, wherein said units are stacked with electrical connects made with bumps.

3. The energy generating device of claim 1, wherein each of said energy harvesting units comprises:
   a base region;
   an absorption region;
   a plurality of doped layers,
      wherein said plurality of doped layers are of opposite conductivity type to said absorption region;
   a first electrode connected to said plurality of doped layers; and
   a second electrode electrically isolated from said tint electrode.

4. The energy generating device according to claim 1, wherein said energy generating device is oriented such that radiation is incident on said daylight energy harvesting unit, such that any daylight energy is substantially absorbed in said daylight energy harvesting unit, and any infrared energy substantially passes through said daylight energy harvesting unit and is substantially absorbed in said infrared energy harvesting unit.

5. The energy generating device of claim 3, wherein said base region is selected from the group consisting of a buffer layer, a substrate, a thinned out buffer layer, a thinned out substrate, and any combination thereof.

6. The energy generating device of claim 1 wherein said CMOS-based integrated circuit is embedded in or integrated into a flexible substrate.

* * * * *